United States Patent
Akita

Patent Number: 6,144,074
Date of Patent: Nov. 7, 2000

[54] SEMICONDUCTOR MEMORY DEVICE HAVING STACK-TYPE MEMORY CELLS AND A METHOD FOR MANUFACTURING THE SAME

[75] Inventor: Hironobu Akita, Yokohama, Japan

[73] Assignee: Kabushiki Kaisha Toshiba, Kawasaki, Japan

[21] Appl. No.: 09/196,548

[22] Filed: Nov. 20, 1998

[30] Foreign Application Priority Data

Nov. 25, 1997 [JP] Japan .................................... 9-323304

[51] Int. Cl.[7] ............................ H01L 23/62; H01L 29/00; H01L 21/8242

[52] U.S. Cl. ............................ 257/355; 257/356; 257/528; 257/529; 257/530; 438/239

[58] Field of Search ........................ 257/306, 310, 257/355, 356, 529, 530, 333, 296, 298, 299, 311, 357, 360, 528, 546; 438/239

[56] References Cited

U.S. PATENT DOCUMENTS

| | | | |
|---|---|---|---|
| 3,935,586 | 1/1976 | Landheer et al. | 357/15 |
| 4,543,597 | 9/1985 | Shibata | 357/23.6 |
| 5,361,234 | 11/1994 | Iwasa | 365/210 |
| 5,386,135 | 1/1995 | Nakazato et al. | 257/369 |
| 5,438,218 | 8/1995 | Nakamura et al. | 257/452 |
| 5,747,843 | 5/1998 | Matsuo et al. | 257/296 |
| 5,889,307 | 3/1999 | Duesman | 257/355 |
| 5,982,007 | 11/1999 | Lee et al. | 257/362 |

OTHER PUBLICATIONS

Park, et al. "A Stack Capacitor Technology with (Ba,Sr)TiO$_3$ Dielectrics and Pt Electrodes for 1Giga–Bit Density DRAM," 1996 Symposium on VLSI Technology Digest of Technical Papers, 3.2, pp. 24–25.

Primary Examiner—Matthew Smith
Assistant Examiner—Lex H. Malsawma
Attorney, Agent, or Firm—Hogan & Hartson LLP

[57] ABSTRACT

At least one dummy storage node is formed for a plurality of storage nodes provided in stack type memory cells in which a plate electrode is grounded through the at least one dummy storage node, thereby charges flowed into the plate electrode being discharged, when dry etching is performed by using charged particles, thus preventing electrical stress from acting on a capacitor dielectric film provided between the storage nodes and the plate electrode.

27 Claims, 9 Drawing Sheets

SEMICONDUCTOR MEMORY DEVICE HAVING STACK-TYPE MEMORY CELLS AND A METHOD FOR MANUFACTURING THE SAME

BACKGROUND OF THE INVENTION

The present invention relates to a semiconductor memory device having stack type memory cells.

In a conventional semiconductor memory device having stack type memory cells, a dielectric film is formed between storage nodes and plate electrodes to form memory cell capacitors.

Figure 15:
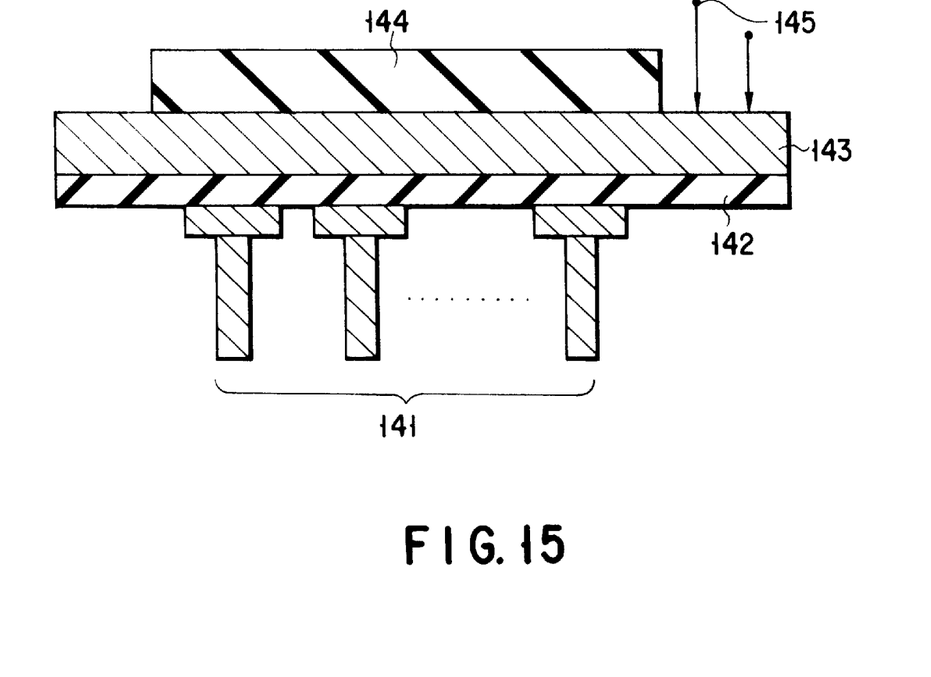
FIG. 15 is a cross-sectional view showing the part of conventional stack type memory cells subjected to the processing of a manufacturing step.

FIG. 15 shows a part of the structures of conventional stack type memory cells. Referring to FIG. 15, a plate electrode 143 is formed above storage nodes 141, with a dielectric film 142 interposed between the plate electrode 143 and the storage nodes 141. After these elements are formed by a manufacturing process such as spin coating, sputtering or CVD (chemical vapor deposition), the plate electrode 143 is covered by a resist 144, and then is processed by a dry-etching technique such as RIE (reactive ion etching) or CDE (chemical dry etching) using charged particles 145, in order for the plate electrode 143 and the dielectric film 142 to have predetermined shapes.

Figure 16:
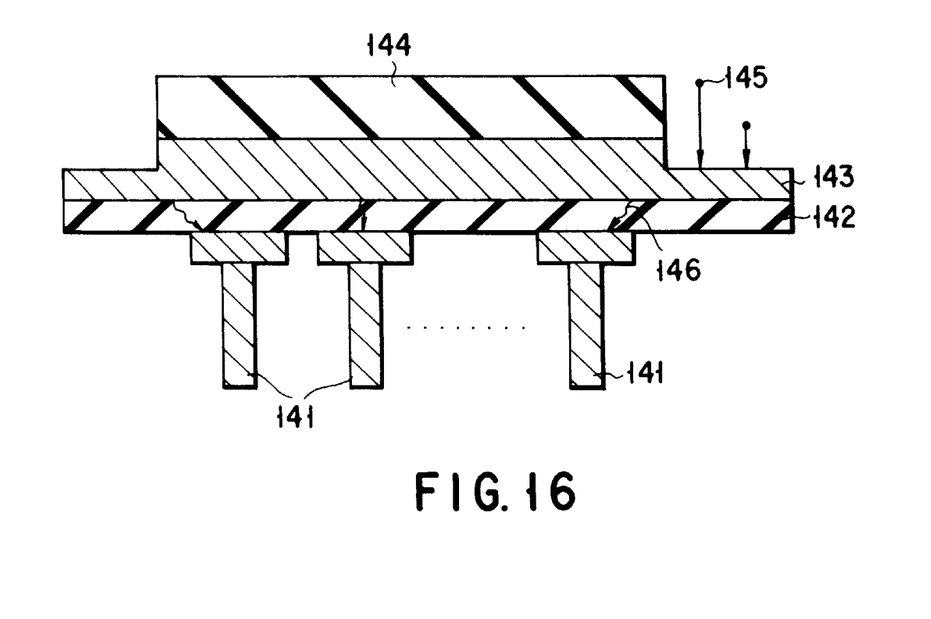
FIG. 16 is a cross-sectional view showing the part of the conventional stack type memory cells subjected to the processing of a manufacturing step subsequent to the step of FIG. 15.

The dry etching technique uses the charged particles 145 accelerated due to an electric field, and makes the charged particles 145 directly collide with the plate electrode 143. In the etching, the plate electrode 143, as shown in FIG. 16, is etched from its surface to a predetermined depth. Since the plate electrode 143 is electrically floated, it is charged up during the etching process. In other words, charges are accumulated in the plate electrode 143.

The accumulated charges move within the plate electrode 143 since the plate electrode 143 is formed of a conductive material. Consequently, electrical stress or a high voltage acts on the entire dielectric film 142, regardless of the distance from the processed (dry-etched) portion of the plate electrode 143. Therefore, there is a case where discharge as represented by reference numeral 146 occurs in the dielectric film 142, and damages it.

Figure 17:
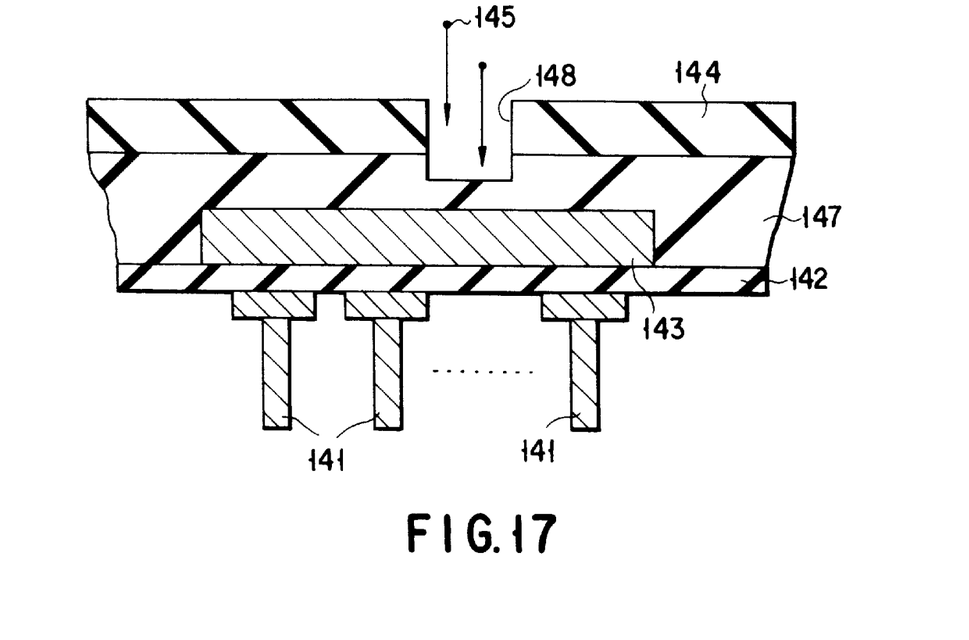
FIG. 17 is a cross-sectional view showing the part of the conventional stack type memory cells subjected to the processing of a manufacturing step subsequent to the step of FIG. 16.

Furthermore, after processing the plate electrode 143 by the dry etching technique, an interlayer insulating film 147 formed of, e.g., $SiO_2$ is provided on the plate electrode 143 as shown in FIG. 17. Provision of the interlayer insulating film 147 is intended for formation of a contact. To be more specific, a contact hole 148 is formed in the interlayer insulating film 147, in order to connect a voltage generating circuit (not shown) and the plate electrode 143. Due to this structure, a given potential can be applied to the plate electrode 143 when the semiconductor memory device is operated.

The contact hole 148 is formed by the dry etching technique in the same manner as the plate electrode 143 shown in FIG. 16. In this case, the contact resistance is high if a part of the interlayer insulating film 147 is remained in the bottom of the contact hole as shown in FIG. 17. Therefore, etching must be sufficiently performed. To be more specific, dry etching is not stopped even after the contact hole 148 reaches the plate electrode 143. In other words, etching is performed until the plate electrode 143 is shallowly cut, i.e., over-etching is performed.

At this time also, the plate electrode 143 is charged up, as a result of which the dielectric film 142 is damaged.

Figure 18:
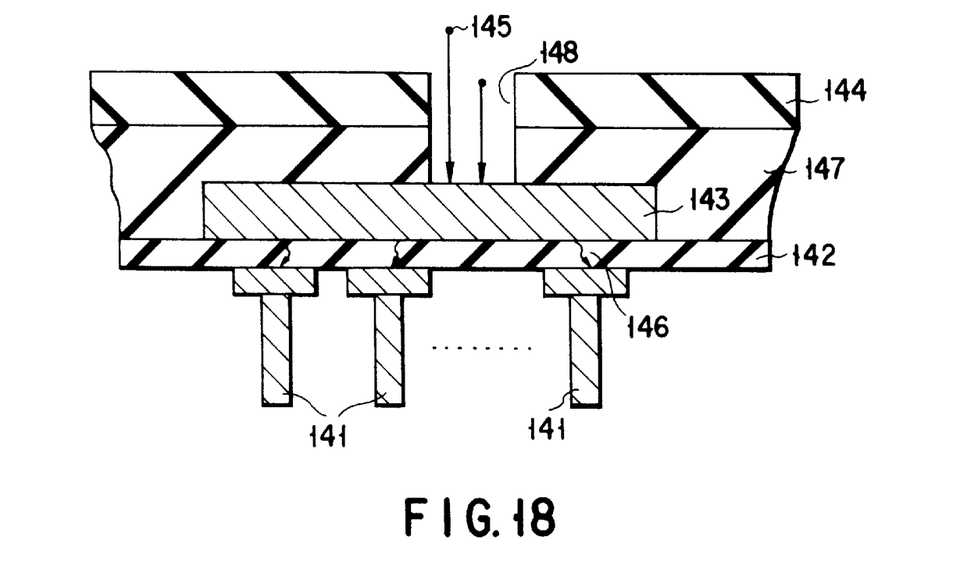
FIG. 18 is a cross-sectional view showing the part of the conventional stack type memory cells subjected to the processing of the final stage of the manufacturing step of FIG. 17.

Furthermore, after the contact hole 148 is formed above the plate electrode 143, it is filled with a conductive material, thereby forming a contact (not shown). Then, an upper wiring layer is also processed by dry etching after it is formed in such a manner a way to be connected to the contact. In this case also, the plate electrode 143 is charged up due to the charge passing through conductive members such as the wiring layer and the contact, and thus the dielectric film 142 of capacitors is damaged.

The memory device can be made smaller and operate at a higher speed, if the dielectric film 142 is formed of a material having a high dielectric constant and formed to have a small thickness. However, this cannot be achieved in the above conventional memory device due to the above-mentioned charge up problem.

Therefore, the present invention has been made in consideration of the above circumstances, and its object is to provide a semiconductor memory device which is made smaller and operates at a higher speed due to the following feature:

The plate electrode of cell capacitors is prevented from being charged during the dry etching process, thus preventing damage of the memory device.

By virtue of this feature, the yield and the reliability are improved, and a dielectric film is made thinner, by using a plurality of dielectric materials having high dielectric constant.

BRIEF SUMMARY OF THE INVENTION

In the semiconductor memory device having stack cell capacitors according to the present invention, a plate electrode is electrically connected to a grounded substrate in order to prevent the cell capacitors from being applied with electrical stress, when the plate electrodes and wiring layers connected to and formed above the plate electrodes are processed by dry etching using charged particles.

The semiconductor memory device according to one aspect of the present invention comprises:

a semiconductor substrate;

a plurality of storage nodes provided in memory cells, respectively, and formed above the semiconductor substrate;

at least one dummy storage node formed together with the plurality of storage nodes and electrically connected to the semiconductor substrate;

a dielectric film formed on the plurality of the plurality of storage nodes, except for the at least one dummy storage node; and a plate electrode formed on the plurality of storage nodes, with the dielectric film interposed between the plate electrode and the plurality of storage nodes, the plate electrode being electrically connected to the at least one dummy storage node.

Furthermore, the method of the present invention, for manufacturing a semiconductor memory device, comprising the steps of:

forming a plurality of storage nodes in memory cells such that the plurality of storage nodes are located above a semiconductor substrate;

forming at least one dummy storage node electrically connected to the semiconductor substrate;

forming a dielectric film on the plurality of storage nodes, except for the at least one dummy storage node; and forming a plate electrode on the plurality of storage nodes, with the dielectric film interposed between the plate electrode and the plurality of storage nodes, the plate electrode being electrically connected to the at least one dummy storage node.

According to the present invention, the aforementioned electrical stress can be prevented from being applied to the dielectric film due to the above features, thus preventing degrading of the dielectric film of the cell capacitors. Accordingly, the present invention can provide a semiconductor device and a method for manufacturing the same, wherein the service life is long, the reliability is improved, the dielectric film is made thinner, and a new material thereof can be used which cannot be used in the conventional memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The semiconductor memory device according to the first embodiment of the present invention will be explained with reference to FIGS. 1 to 4 each of which shows the part of the memory device in different manufacturing steps, respectively.

Figure 1:
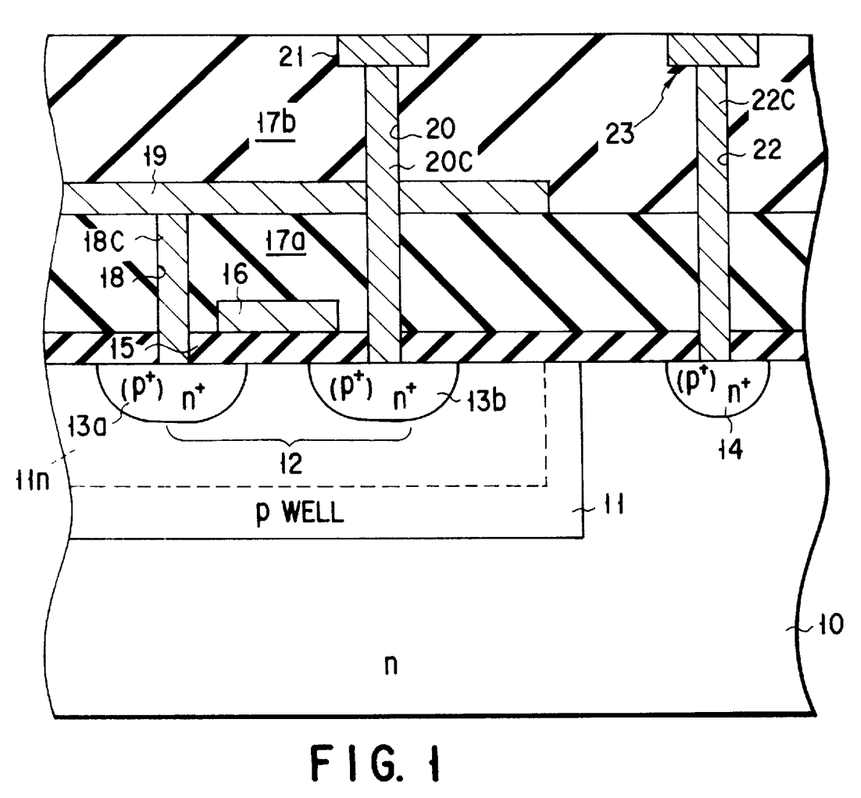
FIG. 1 is a cross-sectional view showing the part of a semiconductor memory device according to the first embodiment of the present invention, which has been subjected to the processing of some of the manufacturing steps.

Referring to FIG. 1, a p-type well 11 is formed on an n-type silicon substrate 10, and two $n^+$-type diffusion layers 13a and 13b are formed in a surface of the p-type well 11 in order to form a transfer gate element 12.

An $n^+$-type diffusion layer 14 is formed outside the p-type well 11 at the same time as the diffusion layers 13a and 13b are formed. A word line 16, which serves as a gate electrode of the transfer gate element 12, is formed on the surface of the p-type well 11 by a photolithography method, with a gate insulating film 15 interposed between the word line 16 and the p-type well 11. The word line 16 is covered by an interlayer insulating film 17a.

The interlayer insulating film 17a has a contact hole 18 reaching the $n^+$-type diffusion layer 13a. The contact hole 18 is filled with a conductive material such as silicon, tungsten and aluminum, thereby forming a contact 18C in the contact hole 18. On the interlayer insulating film 17a, a bit line 19 is formed using a photolithography method.

An interlayer insulating film 17b is formed on the bit line 19, and a storage node hole 20 is formed in the interlayer insulating film 17b, and extends to the $n^+$-type diffusion layer 13b. The storage node hole 20 is filled with the same conductive material as the contact hole 18, forming a contact 20C in the storage node hole 20. Thereafter, by a photolithography method, a storage node 21 is formed on the interlayer insulating film 17b such that it is connected to the contact 20C.

In the same manner as the storage node hole 20 is formed, a dummy contact hole 22 is formed to have the same shape as the storage node hole 20, in a position above the $n^+$-type diffusion layer 14 which as mentioned above, is located outside the p-type well 11. A conductive material such as a metal or polycrystalline silicon is filled into the dummy contact hole 22 to form a contact 22C, and then a dummy terminal 23 is formed and connected to the contact 22C.

Figure 2:
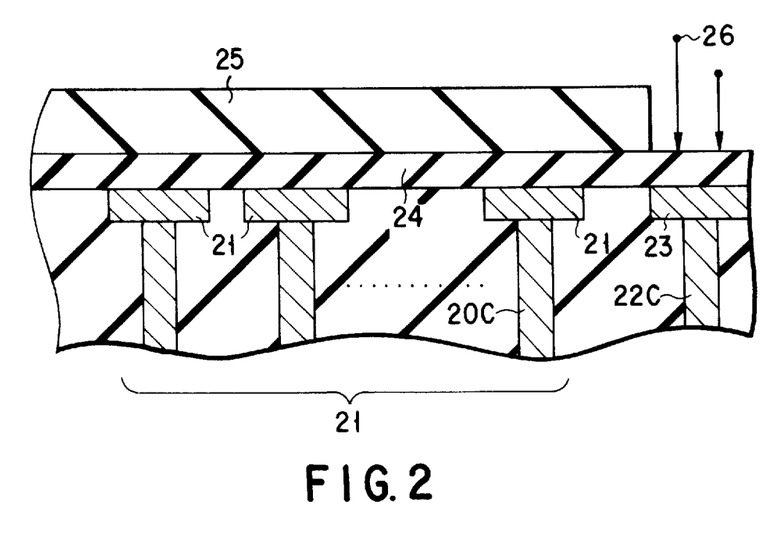
FIG. 2 is a cross-sectional view showing the part of the semiconductor memory device which has been subjected to the processing of a step subsequent to the step of FIG. 1.

Actually, as shown in FIG. 2, a plurality of storage nodes 21 each formed in the above manner are densely arranged.

A capacitor dielectric film 24 of a high dielectric constant is formed on the storage nodes 21 and the dummy terminal 23, and a resist 25 is formed on the capacitor dielectric film 24, as shown in FIG. 2. In the structure shown in FIG. 1, in general, the storage node hole 20 and the dummy contact hole 22 are filled with the same conductive material as the contact hole 18. However, needless to say, those holes may be filled with different conductive materials.

Figure 3:
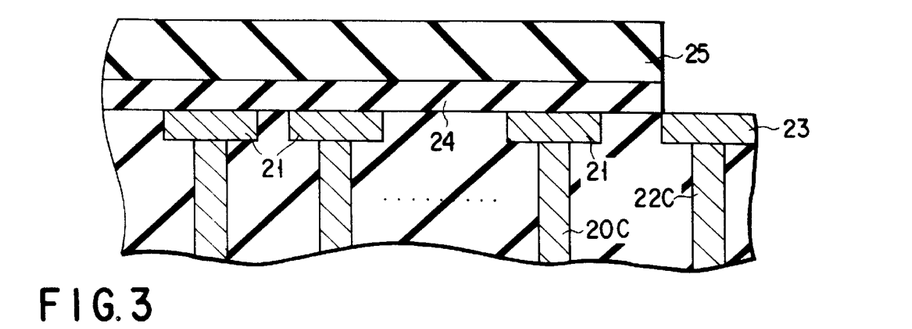
FIG. 3 is a cross-sectional view showing the part of the semiconductor memory device which has been subjected to the processing of a step subsequent to the step of FIG. 2.

In a later manufacturing step, the dielectric film 24 is patterned using the resist 25 as a mask such that the dielectric film 24 has a predetermined pattern. However, before this step, the following steps are carried out:

That portion of the dielectric film 24 which is located above the dummy terminal 23 is removed by a dry etching technique using charged particles 26, such as RIE or CDE, thereby exposing the dummy terminal 23, as shown in FIG. 3. In this case, the charged particles 26 are not accumulated in the dielectric film 24 since the dielectric film 24 is not conductive.

Figure 4:
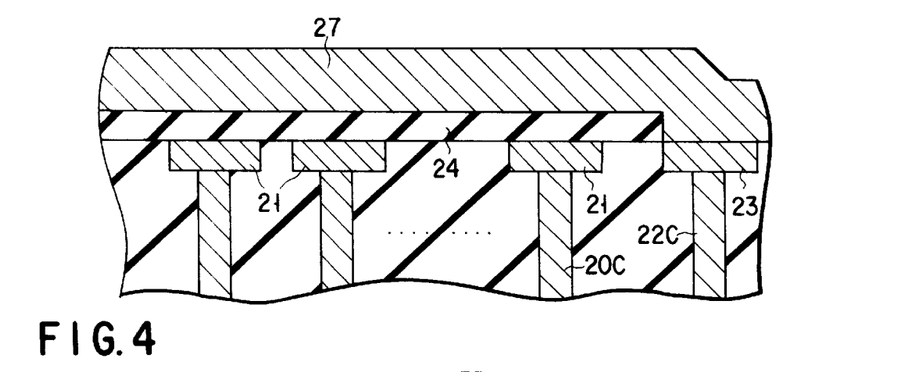
FIG. 4 is a cross-sectional view showing the part of the semiconductor memory device which has been subjected to the processing for forming a plate electrode, which is the processing of a step subsequent to the step of FIG. 3.

Thereafter, the resist 25 is removed to expose the dielectric film 24, and as shown in FIG. 4, a plate electrode 27 of a metal is formed on the dielectric film 24 and the dummy terminal 23.

As may be understood from the above, in the first embodiment, the plate electrode 27 is ohmic-connected to the n-type substrate 10, which is grounded, by the diffusion layer 14, and thus the plate electrode 27 is grounded, with the dummy terminal 23 and the contact 22C interposed between the plate electrode 27 and the diffusion layer 14. Grounding of the n-type substrate 10 is performed while the semiconductor memory device, i.e., the DRAM is being manufactured. For example, it can be achieved by grounding that metal base on the manufacturing line of the DRAM, on which the substrate 10 is to be put.

Referring to FIG. 1, the storage node 21 is connected to the diffusion layer 13b which functions as the source or drain of a MOSFET, i.e., the transfer gate device 12. Generally, the transfer gate device 12 is formed within the p-type well 11, and is not directly electrically connected to the substrate 10.

Therefore, the dummy terminal 23, which as explained above has the same shape as the storage node 21, is provided outside the p-type well 11 such that it is directly electrically connected to the substrate 10. As in the structure shown in FIG. 1, in the case where an n-type MOSFET is formed as the transfer gate device 12 in the p-type well 11 formed in the n-type substrate 10, the dummy terminal 23 uses the $n^+$-type diffusion layer 14 which is of the same conductive type as the n-type substrate 10, in order for the dummy terminal 23 to be electrically ohmic-connected to the n-type substrate 10. Accordingly, the dummy terminal 23 can be formed at the same time and in the same process as the storage node 21.

Therefore, provision of the dummy terminal 23 does not increase the number of manufacturing steps.

Figure 5:
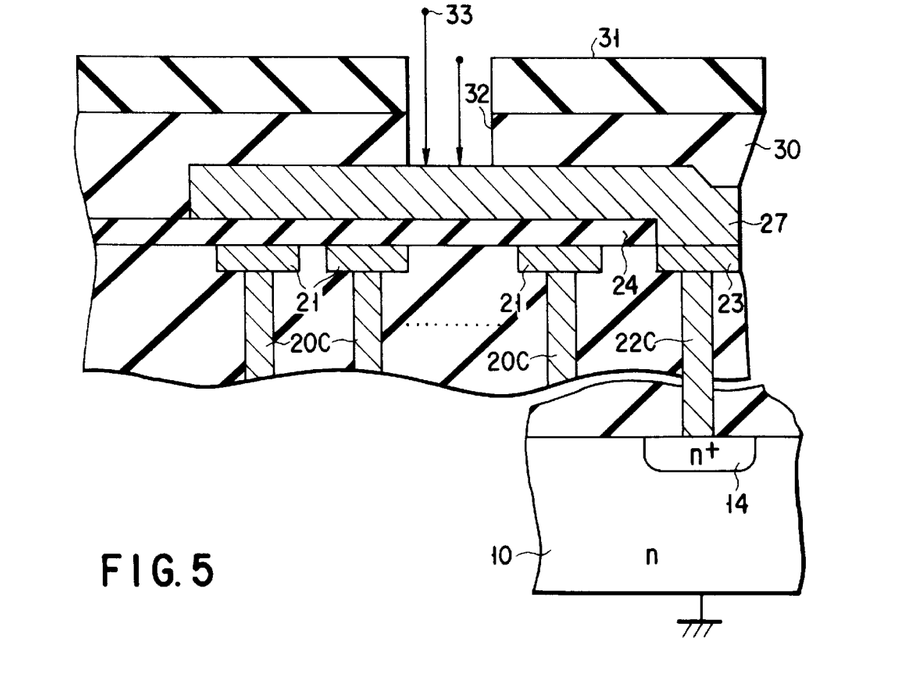
FIG. 5 is a cross-sectional view showing the part of the semiconductor memory device which has been subjected to the processing for performing dry etching which is the processing of a step subsequent to the step of FIG. 4.

Furthermore, after the plate electrode 27 is grounded using the dummy electrode 23 and the contact 22C, an interlayer insulating film 30 formed of, e.g., $SiO_2$ is provided on the plate electrode 27, and the resist 31 is provided on the interlayer insulating film 30, as shown in FIG. 5.

Then, the plate electrode 27 is connected to a voltage generating circuit which will be described later, in order to give a specific potential to the plate electrode 27 when the DRAM is operated. To achieve this connection, a contact hole 32 is formed in the interlayer insulating film 30 formed on the plate electrode 27.

To be more specific, when the contact hole 32 is formed, the surface of the plate electrode 27 is also subjected to dry-etching processing using the charged particles 33. At this time, a large amount of charge flows into the plate electrode 27. However, the charge does not damage the dielectric film 24 since the plate electrode 27 is connected to a ground through the dummy electrode 23 and the contact 22C.

Furthermore, after the contact hole 32 is formed above the plate electrode 27, a conductive material is filled into the contact hole 32 to form a contact therein, and then an upper wiring layer is formed and connected to the contact. In addition, there is a case where the upper wiring layer is processed by using dry etching. In this case also, charge flows into the plate electrode 27 through the wiring layer and the contact which are conductive. However, it does not damage the dielectric film 24 included in the capacitors since the charges flowed into the plate electrode 27 is discharged.

In such a manner, according to the first embodiment, charge is prevented from being accumulated. Thus, the dielectric film 24 can be formed of a material having a high dielectric constant, and have a smaller thickness than that of the conventional semiconductor memory device, as a result of which the DRAM is made smaller, and can operate at a higher speed.

In the first embodiment shown in FIGS. 1 to 5, the plate electrode 27, as explained above, is connected to the substrate 10, with the dummy terminal 23 and the contact 22C interposed between the plate electrode 27 and the substrate 10. This connection is maintained also after the semiconductor memory device has completely been manufactured. However, this is applied to the case where the plate electrode 27 and the substrate 10 are used at the same potential when the device is operated.

Furthermore, in the structure shown in FIG. 1, an n-type well 11n, as shown in a broken line, may be further formed within the p-type well 11. In this case, the conductive type of the diffusion layers 13a and 13b are changed from $n^+$ to $p^+$.

In addition, the device of the first embodiment uses the $n^+$-type diffusion layer 14 provided in the n-type substrate 10 in order to connect the plate electrode 27 and the substrate 10. In this case, the conductive types of the substrate 10, the well 11, and the transfer gate device 12 may be reversed. This example is shown as the second embodiment in FIG. 6. Accordingly, the semiconductor memory device (DRAM) of the second embodiment will be explained with reference to FIG. 6 which shows the part of the device.

Figure 6:
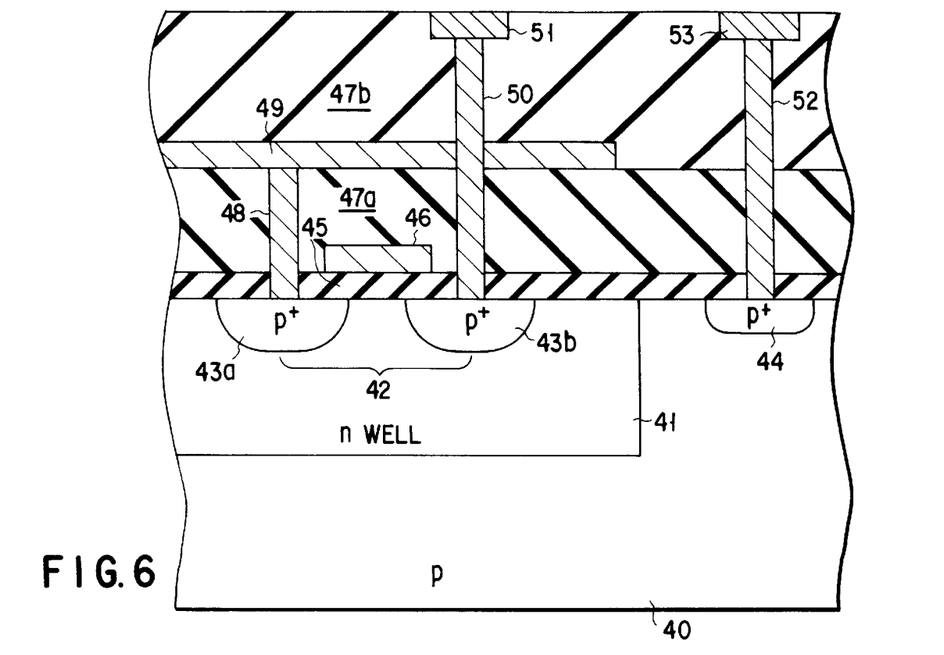
FIG. 6 is a cross-sectional view showing the part of a semiconductor memory device according to the second embodiment, which has been subjected to the processing of some of the manufacturing steps.

In the structure shown in FIG. 6, a $p^+$-type diffusion layer 44 is formed in a p-type substrate 40, and a dummy electrode 53 and a contact 52 are ohmic-connected to the p-type substrate 40, achieving grounding. The structure of in FIG. 6 is the same as that of FIG. 1, except for the conductive types of structural elements. To be more specific, in the structure of FIG. 6, $p^+$-type diffusion layers 43a and 43b are formed within the n-type well 41 formed in the p-type substrate 40, and respectively serve as the source and drain of the transfer gate device 42. Between the $p^+$-type diffusion layers 43a and 43b, a word line 46 serving as the gate is formed, with a gate oxide film 45 interposed between the word line 46 and the $p^+$-type diffusion layers 43a and 43b. The $p^+$-type diffusion layer 43a is connected to a bit line 49 by a contact 48 formed in an interlayer insulating film 47a.

Furthermore, in the structure of FIG. 6, contacts 50 and 52 are formed in the interlayer insulating films 47a and 47b, and a storage node 51 and the dummy electrode 53 are formed and connected to ends of the contacts 50 and 52, respectively. Thereafter, a plate electrode (not shown) is formed and connected to the dummy terminal 53 as in the structure of FIG. 5. As a result, electrical stress is prevented from acting on a capacitor dielectric film formed between the plate electrode and the storage node, even if charged particles flow into the plate electrode in a manufacturing step using dry etching.

In the structure of FIG. 5, in the case where the dummy electrode 23 and the plate electrode 27 are formed of the same conductive material, they are connected to each other to have a low connection resistance. This connection is advantageous with respect to electrical conductivity.

On the other hand, in the case where the dummy electrode 23 and the plate electrode 27 are formed of different materials, there is a case where a corrosion generates due to an electrochemical reaction at the contact portion between the dummy electrode 23 and the plate electrode 27. Therefore, the contact portion needs barrier metal. In this case, with the structure of FIG. 3, the dielectric film 24 is dry-etched, and then barrier metal (not shown) is formed on the dummy electrode 23, with a remaining resist 25 used as a mask. Then, the resist 25 is removed, as a result of which the barrier metal is formed only on the dummy electrode 23.

Furthermore, in the structure shown in FIG. 6, if an n-type diffusion layer (not shown) is formed instead of the p$^+$-type diffusion layer 44, pn junction is provided between the n-type diffusion layer and the p-type substrate. The conductivity of the pn junction is reverse to the current flowing from the dummy electrode 53 to the substrate 40. Accordingly, the pn junction effectively functions for an operating voltage which is applied after the semiconductor memory device is manufactured. However, the pn junction easily effects electric conduction when a high voltage due to charged particles for use in ion etching is applied, thus permitting charge to move through the pn junction.

In such a manner, even if the p$^+$-type diffusion layer 44 is not provided, the same effect can be obtained as in the above pn junction, based on a similar concept, by providing metal (e.g., aluminum Al, platinum Pt and gold Au are used for p-type silicon and aluminum Al, platinum Pt, tungsten W and gold Au are used for n-type silicon), which can achieve Schottky junction between the contact 52 and the substrate 40, provided therebetween, or by filling the metal into the contact 52.

Figure 7:
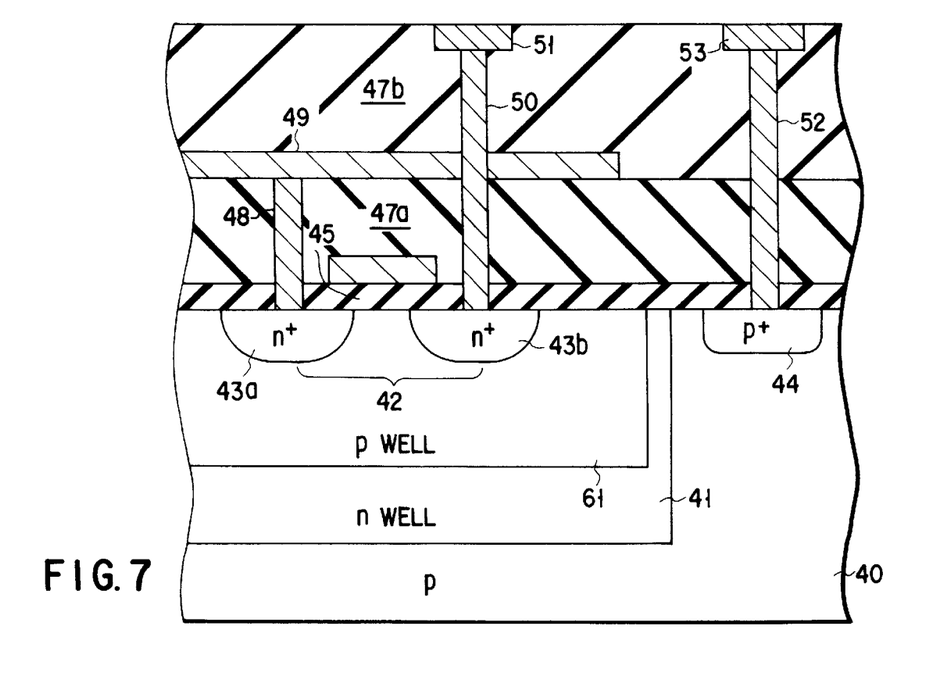
FIG. 7 is a cross-sectional view showing the part of a semiconductor memory device according to the third embodiment, which has been subjected to the processing of a manufacturing step.

Moreover, the structure of FIG. 6 may be provided as follows: a p-type well (not shown) is further provided in the n-type well 41, and a transfer gate is formed in the p-type well. This example is shown as the third embodiment in FIG. 7. The structure shown in FIG. 7 is the same as that of FIG. 6, apart from that a transfer gate device 42 is formed in a double diffusion well 61 provided above the p-type substrate 40. Accordingly, in the structure of FIG. 7, structural elements identical to that of FIG. 6 will be denoted by the same reference numerals, and their detailed explanations will be omitted. The p+ type layer 44 may be formed in the same step when p+ type diffusion layers (not shown) for MOSFETs are formed. Accordingly, the formation of the p+ type layer 44 does not increase the number of the manufacturing steps.

In the structure of FIG. 7, needless to say, the conductive type of each of the conductive-type structural elements may be switched from p to n or vice versa. After the DRAM is manufactured, a predetermined potential is applied to the plate electrode 27 at an operating time at which the semiconductor memory device operates. In this method, the potential can be applied from the wiring layer provided above the plate electrode 27 to the plate electrode 27, or it can be applied from the substrate 10 to the plate electrode 27, since the plate electrode 27 is connected to the substrate 40.

In the structure of FIG. 5, after the DRAM is manufactured, the connection of the substrate 10 and plate electrode 27 may be maintained in the case where the substrate 10 and the plate electrode 27 are used at the same potential at the operating time. However, the substrate 10 and the plate electrode 27 must be electrically separated from each other on shipment in the case where they are used at different potentials at the operating time.

Figure 8:
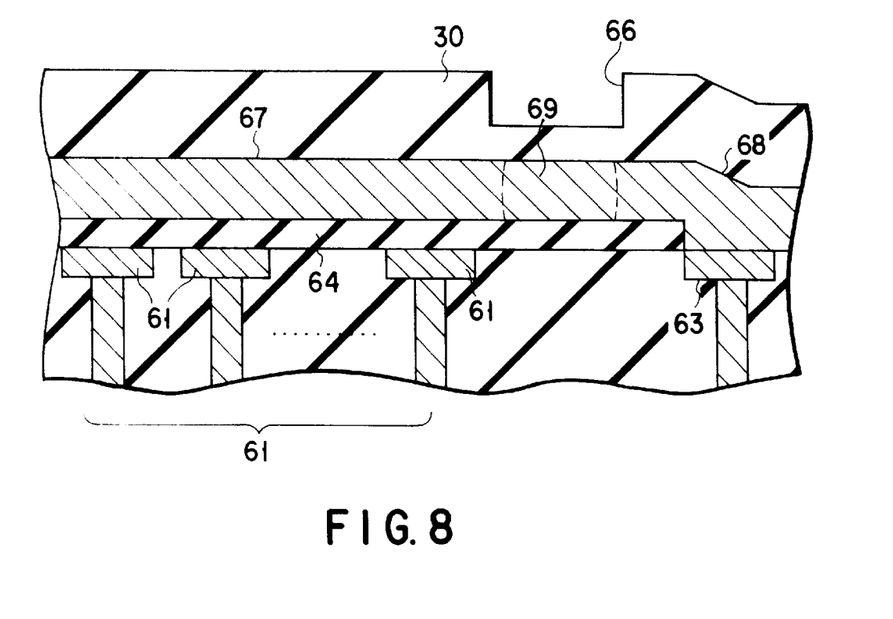
FIG. 8 is a cross-sectional view showing the part of a semiconductor memory device according to the fourth embodiment, which has a plate electrode provided with a fuse.
Figure 9:
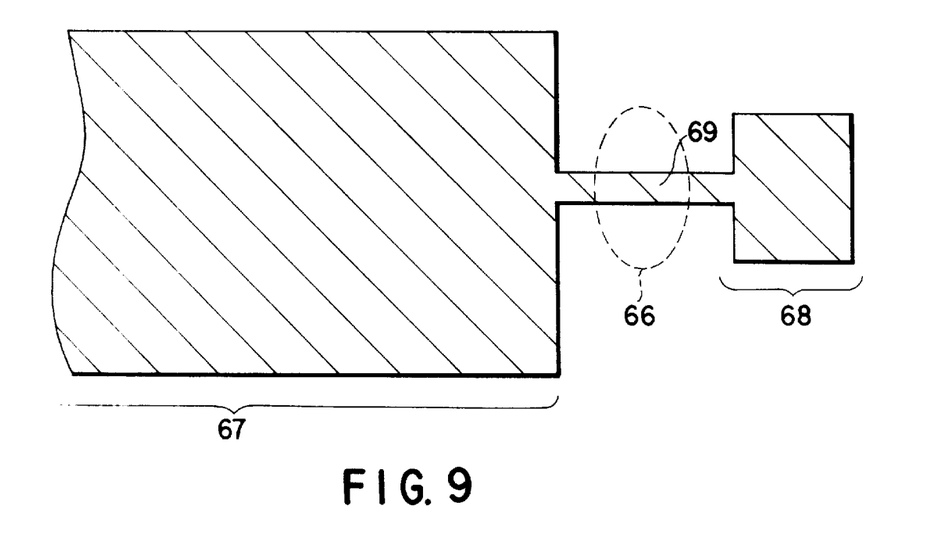
FIG. 9 is a plan view of the part shown in FIG. 8.

More specifically, in the case where a MOS FET serving as a transfer gate device is directly formed on the semiconductor substrate, a back gate voltage is applied to the MOSFET, and thus a potential differing in level from the potential of the plate electrode needs to be applied to the semiconductor substrate. To achieve this, the semiconductor substrate must be electrically separated from the plate electrode. In order to do so, the following method is provided: a path for grounding the plate electrode is connected to the semiconductor substrate through a fuse during the manufacturing process, and the fuse is cut after the process is completed. This method will be explained in detail as follows:

FIGS. 8 and 9 show the fourth embodiment of the present invention, which uses a fuse as cutting means. In the fourth embodiment, an elongated connection portion is formed as a fuse 69 between a plate electrode 67 provided opposite to storage nodes 61 via a dielectric film 64 and a ground electrode portion 68 connected to a dummy terminal 63. In this case, the same steps are carried out as in the first embodiment shown in FIGS. 2 and 5, thereby forming the plate electrode 67, the ground electrode portion 68, and the fuse 69 in the above arrangement pattern.

The fourth embodiment is the same as the first embodiment, apart from that the entire plate electrode portion, as shown in FIGS. 8 and 9, comprises the plate electrode 67 opposite to the storage nodes 61, the ground electrode portion 68 connected to the dummy terminal 63 having the same shape as the storage node 61, and the fuse 69 provided between the portion 67 and the ground electrode portion 68.

According to a method, a laser is used to cut the fuse 69, after the DRAM is manufactured. In this method, a window 66 for the laser blow is provided above the fuse 69. Provision of the window 66 does not increase the number of manufacturing steps for the following reason: the window 66 is formed in that portion of an insulating film 30 which is located above the fuse 69, and thus it can be formed in the same step as the contact hole 32 formed in the insulating film 30, for use in applying a potential to the plate electrode 27 shown in FIG. 5. In addition, a current fuse or the like which is cut by electric current can be used instead of the method using the laser blow.

Furthermore, in the fourth embodiment, the fuse is provided in the wiring layer serving as the plate electrode. However, it may be done in any of the wiring layers serving as the word line, the bit line and the storage nodes.

With respect to all the first to fourth embodiments, the above explanations are made by referring to one plate electrode and a plurality of stack type memory cells under the plate electrode. However, in fact, one DRAM chip has a plurality of plate electrodes, and a plurality of memory cells are formed under each of the plate electrodes.

The manner of connecting the plate electrodes varies in accordance with the purpose of use of the DRAM as follows:

1. In the first case, the plate electrodes are not connected to each other. In this case, each of the plate electrodes requires a ground electrode connected to the dummy electrode, and further a fuse for use in cutting each plate electrode and the associated ground electrode. In addition, each plate electrode needs to be connected to a corresponding plate potential generation circuit, in order to keep the potential of each plate electrode at a predetermined level.

Figure 10:
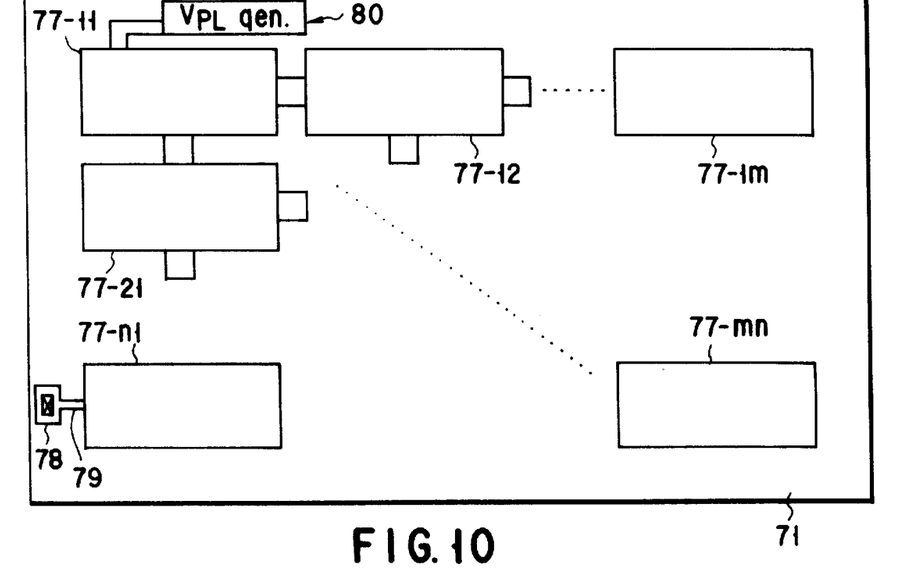
FIG. 10 is a plan view showing arrangement of plate electrodes in one DRAM chip formed according to the present invention.

2. Second, the plate electrodes are connected to each other within the DRAM chip. In this case, as shown in FIG. 10, one dummy electrode, i.e., one ground electrode 78 and one fuse 79 are provided for all plate electrodes 77-11, 77-12 ... 77-mn arranged in a matrix in the DRAM chip 71. However, needless to say, a plurality of ground electrodes 78 and a plurality of fuses 79 may be provided in order to increase the reliability of the DRAM. Furthermore, the number of plate potential ($V_{PL}$) generating circuits 80 required for this second case is only one.

Referring to FIG. 10, the plate potential ($V_{PL}$) generating circuit 80 is formed in an upper left region of the DRAM chip 71 as viewed from above. However, the position of the plate potential ($V_{PL}$) generating circuit 80 can be freely determined when the DRAM is designed.

Figure 12:
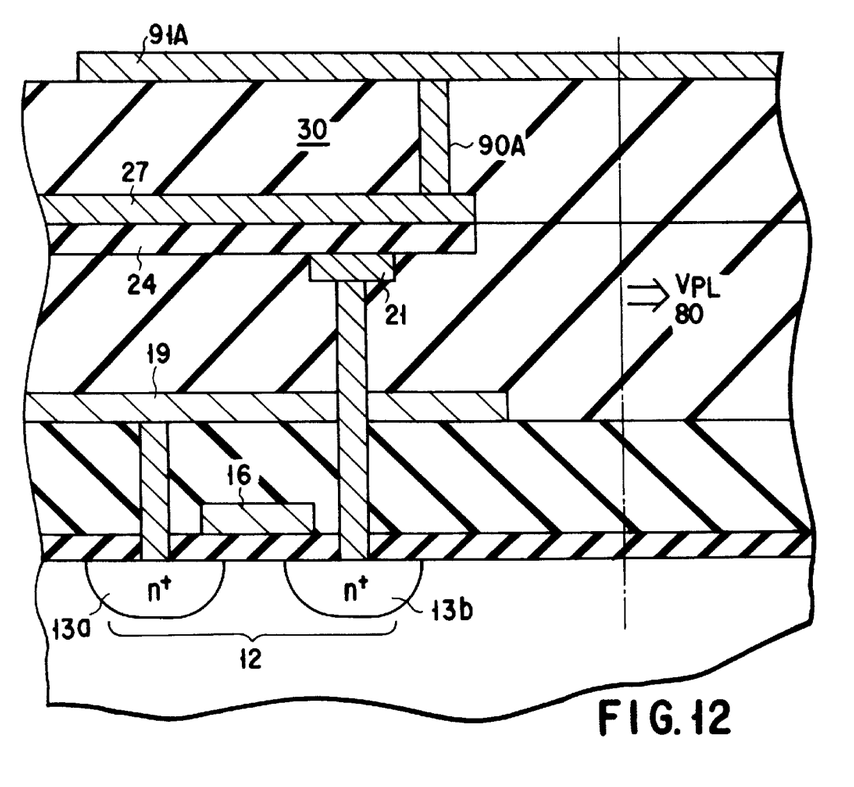
FIG. 12 is a cross-sectional view for illustrating an exemplary method of connecting a plate electrode and a plate potential generating circuit.

The plate potential ($V_{PL}$) generating circuit 80 can be connected to the plate electrodes 77-11, 77-12 ... 77-mn through the wiring layer provided above or under the plate electrodes. For example, as shown in FIG. 12, a wiring layer 91A is formed above the plate electrode 27, with an interlayer insulating film 30 interposed between the wiring layer 91A and the plate electrode 27, and can be connected to the plate potential ($V_{PL}$) generating circuit 80 via the wiring layer 91A. The plate electrode 27 is connected to the wiring layer 91A by a contact 90A formed in the interlayer insulating film 30.

Figure 13:
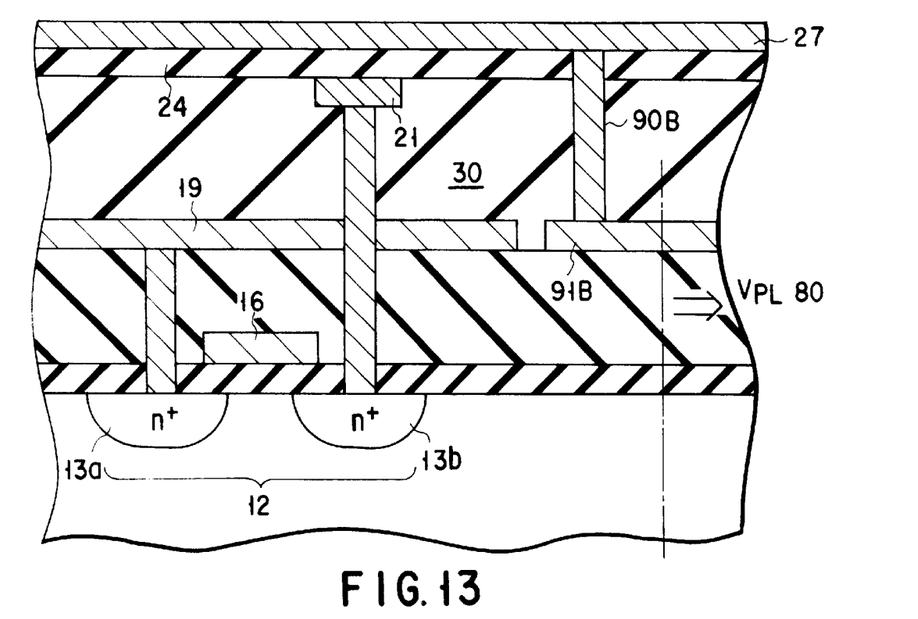
FIG. 13 is a cross-sectional view for illustrating another exemplary method of connecting the plate electrode and the plate potential generating circuit.

In the example shown in FIG. 13, the plate electrode 27 is connected to the plate potential ($V_{PL}$) generating circuit 80 by a contact 90B and a wiring layer 91B formed in the same layer as a bit line 19.

Figure 14:
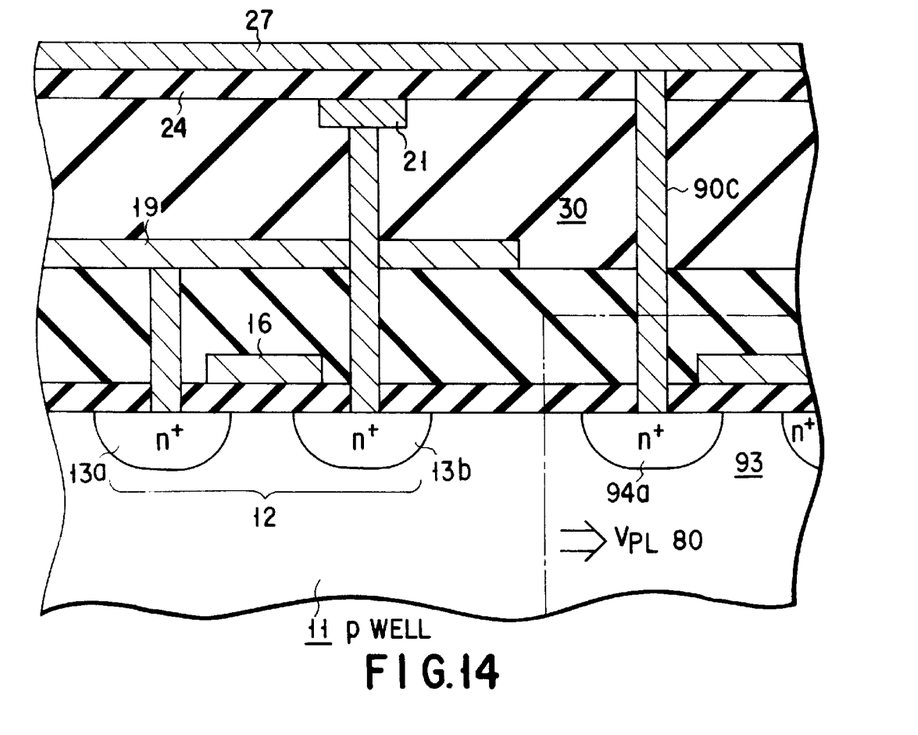
FIG. 14 is a further exemplary method of connecting the plate electrode and the plate potential generating circuit.

Furthermore, in the example shown in FIG. 14, the plate electrode 27 is connected to an n$^+$-type diffusion layer 94a of an output gate device 93 of the plate potential ($V_{PL}$) generating circuit 80. The circuit 80 is formed in a p-type well 11 in which the transfer gate device 12 of the memory cell is formed. However, needless to say, it may be formed in another well in which the transfer gate device 12 is not formed.

In addition, the wiring layer formed above the plate electrodes can be applied for connecting the plate electrodes commonly. In this case, fuses need to be provided for the plate electrodes, respectively.

Alternatively, a layer including the plate electrodes or a wiring layer formed under the layer can be used to connect the plate electrodes, commonly. In this case, only one fuse may be provided for all the plate electrodes.

Furthermore, in the structure shown in FIG. 10, the fuse 79 is formed within a DRAM chip 71. However, a step of cutting the fuse 79 can be omitted for the following reason:

In general, a plurality of DRAM chips are formed in a silicon wafer at the same time, and finally cut from each other along dicing lines on the silicon wafer, thereby providing DRAMs as finished products. Therefore, fuses can also be cut when the DRAM chips are cut, if they are formed outside the chips and arranged inside the dicing lines. This method, as mentioned above, does not need the step of cutting the fuses. An example of the method is illustrated in FIG. 11, and thus will be explained with reference thereto.

Figure 11:
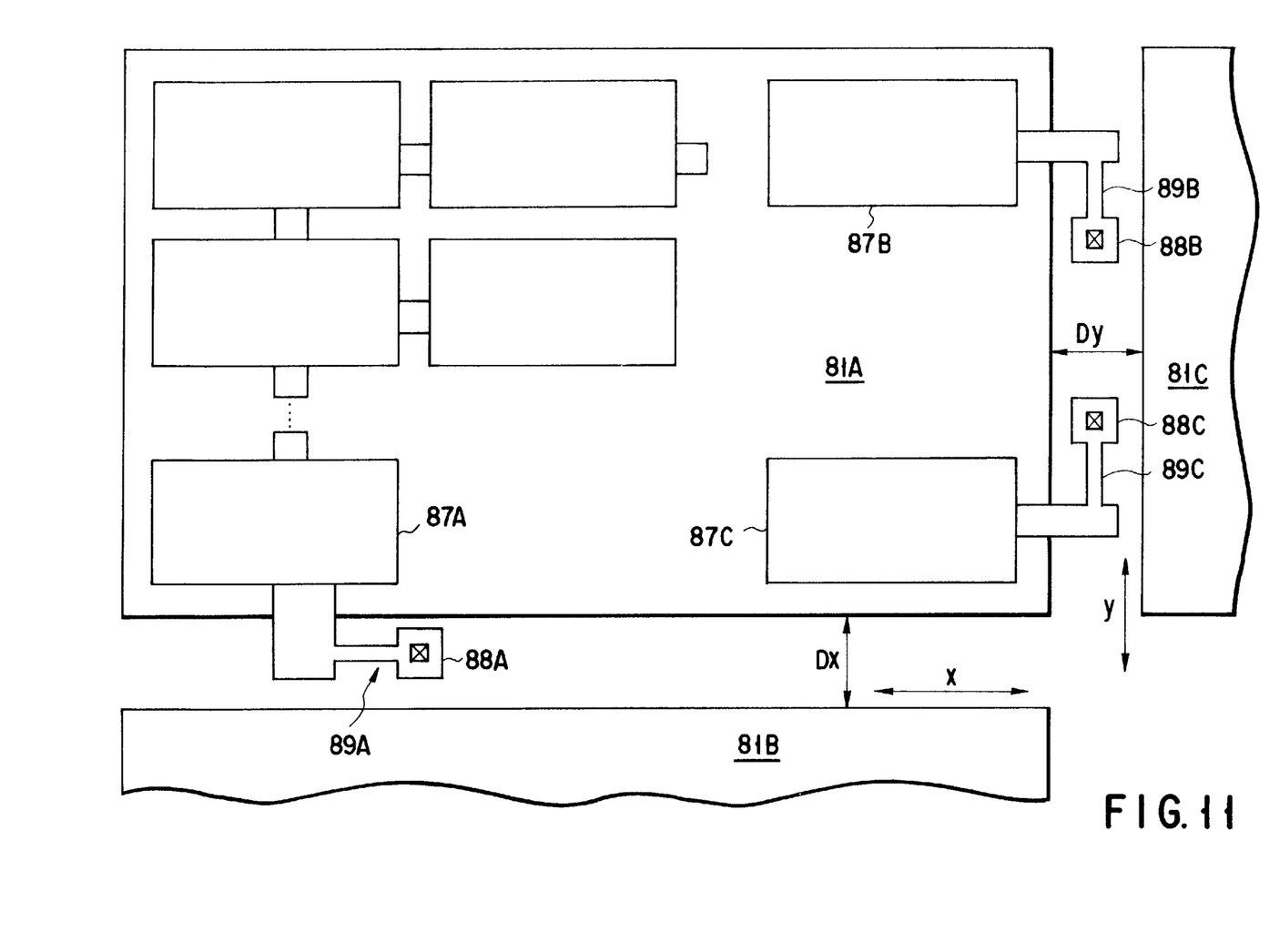
FIG. 11 is a plan view showing DRAM chips formed in a silicon wafer, according to the present invention.

In the last manufacturing step, a plurality of DRAM chips formed in a silicon wafer (FIG. 11 shows only three DRAM chips 81A, 81B and 81C) are cut from each other along perpendicular dicing lines x and y which have widths Dx and Dy, respectively. As a result, in the example of FIG. 11, fuses 89A, 89B and 89C and ground electrodes 88A, 88B and 88C for use in contacting the plate electrodes 87A, 87B, ..., and the semiconductor substrate are cut off from the DRAM chip 81A, for example. This is because the fuses 89A, 89B and 89C and the ground electrodes 88A, 88B and 88C are located within the dicing lines x and y having the widths Dx and Dy.

In the example of FIG. 11, the ground electrodes 88A, 88B and 88C and the fuses 89A, 89B and 89C are specifically shaped. However, the fuses 89A, 89B and 89C do not need to be so. In other words, they have only to form ordinary wiring layers, because thee fuses are not subjected to a fusing step using a laser or current but to a dicing step.

Furthermore, according to the above explanations of the embodiments, the dummy electrode is formed in the same wiring layer as the storage nodes, and the plate electrode is connected to the semiconductor substrate by the contact formed in the interlayer insulating film, and thus is grounded through the dummy electrode and the contact.

However, it is not necessary to ground the plate electrode through the contact, if the following method is adopted: when the dummy electrode is formed in the manufacturing process, a part of the dummy electrode is extended to the outside of that peripheral portion of the wafer at which the dielectric film is not formed, and the dummy electrode is grounded outside the peripheral portion of the wafer via grounding portion provided on the wafer conveying belt, for example. Accordingly, as stated above, it is unnecessary to ground the semiconductor substrate through the contact.

As explained in detail above, according to the present invention, degrading of the capacitors of the stack cells is avoided, the yield is improved, and the leakage current caused by high voltage stress is reduced, thus improving the charge holding characteristics of the memory cells. Furthermore, the present invention enables use of cell capacitors having a dielectric layer of a small thickness which cannot be used in conventional semiconductor memory devices. Thus, the present invention can provide a semiconductor memory device which has a smaller size, and can operate at a higher speed. In addition, in the dynamic type semiconductor memory device of the present invention, and the method thereof for manufacturing the device, each of capacitors is formed of new material which cannot be used in the conventional plate electrode-processing since it causes a structural element to be electrically damaged and degraded.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   a plurality of storage nodes provided in a memory cell, and formed on the semiconductor substrate;

at least one dummy storage node formed together with the plurality of storage nodes, said at least one dummy storage node being electrically connected to the semiconductor substrate;

a dielectric film formed on the plurality of storage nodes, except for said at least one dummy storage node; and a plate electrode formed on the plurality of storage nodes, with the dielectric film interposed between the plate electrode and the plurality of storage nodes, the plate electrode being electrically connected to said at least one dummy storage node.

2. The semiconductor memory device according to claim 1, wherein said at least one dummy storage node is electrically connected to the semiconductor substrate by at least one contact which is ohmic-connected to the semiconductor substrate.

3. The semiconductor memory device according to claim 1, wherein said at least one dummy storage node is electrically connected to the semiconductor substrate by at least one metal contact which forms a Schottky junction with the semiconductor substrate.

4. The semiconductor memory device according to claim 1, wherein said at least one dummy storage node is electrically connected to the semiconductor substrate by at least one metal contact which is directly connected to the semiconductor substrate.

5. The semiconductor memory device according to claim 1, wherein said at least one dummy storage node is electrically connected to the semiconductor substrate by at least one polycrystalline semiconductor contact directly connected to the semiconductor substrate.

6. A semiconductor memory device comprising:

an n-type semiconductor substrate;

a p-type well formed in the n-type semiconductor substrate;

a plurality of first n-type regions formed in the p-type well;

a plurality of storage nodes provided in memory cells, respectively, and electrically connected to the first n-type regions;

at least one second n-type region formed in the n-type semiconductor substrate;

at least one dummy storage node electrically connected to said at least one second n-type region such that said at least one dummy storage node is together with the plurality of storage nodes;

a dielectric film formed on the plurality of storage nodes, except for said at least one dummy storage node; and a plate electrode formed on the plurality of storage nodes, with the dielectric film interposed between the plate electrode and the plurality of storage nodes, the plate electrode being electrically connected to said at least one dummy storage node.

7. A semiconductor memory device comprising:

a p-type semiconductor substrate;

an n-type well formed in the p-type semiconductor substrate;

a plurality of first p-type regions formed in a surface of the n-type well;

a plurality of storage nodes provided in memory cells, respectively, and electrically connected to the first p-type regions;

at least one second p-type region formed in a surface of the p-type semiconductor substrate;

at least one dummy storage node electrically connected to said at least one second p-type region such that said at least one dummy storage node is located together with the plurality of storage nodes;

a dielectric film formed on the plurality of storage nodes, except for said at least one dummy storage node; and a plate electrode formed on the plurality of storage nodes, with the dielectric film interposed between the plate electrode and the plurality of storage nodes, the plate electrode being electrically connected to said at least one dummy storage node.

8. The semiconductor memory device according to claim 7, wherein said at least one dummy storage node is electrically connected to the p-type semiconductor substrate by a contact which is ohmic-connected to the p-type semiconductor substrate, with the at least one second p-type region interposed between said contact and the p-type semiconductor substrate.

9. The semiconductor memory device according to claim 7, wherein said at least one dummy storage node is electrically connected to the p-type semiconductor substrate by a metal contact forming a Schottky junction with the p-type semiconductor substrate.

10. The semiconductor memory device according to claim 7, wherein said at least one dummy storage node is electrically connected to the p-type semiconductor substrate by a metal contact which is directly connected to the p-type semiconductor substrate.

11. The semiconductor memory device according to claim 7, wherein said at least one dummy storage node is electrically connected to the p-type semiconductor substrate by a polycrystalline semiconductor contact which is directly connected to the p-type semiconductor substrate.

12. A semiconductor memory device comprising:

a p-type semiconductor substrate;

an n-type well formed in the p-type semiconductor substrate;

a p-type well formed within the n-type well;

a plurality of n-type regions formed in a surface of the p-type well;

a plurality of storage nodes provided in memory cells, respectively, and electrically connected to the n-type regions;

at least one p-type region formed in a surface of the p-type semiconductor substrate;

at least one dummy storage node electrically connected to said at least one p-type region such that said at least one dummy storage node is located together with the plurality of storage nodes;

a dielectric film formed on the plurality of storage nodes, except for said at least one dummy storage node; and a plate electrode formed on the plurality of storage nodes, with the dielectric film interposed between the plate electrode and the plurality of storage nodes, the plate electrode being electrically connected to said at least one dummy storage node.

13. A semiconductor memory device comprising:

an n-type semiconductor substrate;

a p-type well formed in the n-type semiconductor substrate;

an n-type well formed within the p-type well;

a plurality of first p-type regions formed in a surface of the n-type well;

a plurality of storage nodes provided in memory cells, respectively, and electrically connected to the first p-type regions;

at least one second p-type region formed in a surface of the n-type semiconductor substrate;

at least one dummy storage node electrically connected to said at least one second p-type region such that said at least one dummy storage node is located together with the plurality of storage nodes;

a dielectric film formed on the plurality of storage nodes, except for said at least one dummy storage node; and a plate electrode formed on the plurality of storage nodes, with the dielectric film interposed between the plate electrode and the plurality of storage nodes, the plate electrode being electrically connected to said at least one dummy storage node.

14. A semiconductor memory device comprising:

a semiconductor substrate;

a plurality of storage nodes provided in a memory cell, and formed on the semiconductor substrate;

at least one dummy storage node formed together with the plurality of storage nodes, said at least one dummy storage node being electrically connected to the semiconductor substrate;

a dielectric film formed on the plurality of storage nodes, except for said at least one dummy storage node;

a plate electrode formed on the plurality of storage nodes, with the dielectric film interposed between the plate electrode and the plurality of storage nodes; and a fuse electrically connected between said plate electrode and said semiconductor substrate through said at least one dummy storage node.

15. The semiconductor memory device according to claim 14, wherein said at least one dummy storage node is electrically connected to the semiconductor substrate by at least one contact which is ohmic-connected to the semiconductor substrate.

16. The semiconductor memory device according to claim 14, wherein said at least one dummy storage node is electrically connected to the semiconductor substrate by at least one metal contact which forms a Schottky junction with the semiconductor substrate.

17. The semiconductor memory device according to claim 14, wherein said at least one dummy storage node is electrically connected to the semiconductor substrate by at least one metal contact which is directly connected to the semiconductor substrate.

18. The semiconductor memory device according to claim 14, wherein said at one dummy storage node is electrically connected to the semiconductor substrate by at least one polycrystalline semiconductor contact directly connected to the semiconductor substrate.

19. A semiconductor memory device comprising:

an n-type semiconductor substrate;

a p-type well formed in the n-type semiconductor substrate;

a plurality of first n-type regions formed in the p-type well;

a plurality of storage nodes provided in memory cells, respectively, and electrically connected to the first n-type regions;

at least one second n-type region formed in the n-type semiconductor substrate;

at least one dummy storage node electrically connected to said at least one second n-type region such that said at least one dummy storage node is together with the plurality of storage nodes;

a dielectric film formed on the plurality of storage nodes, except for said at least one dummy storage node;

a plate electrode formed on the plurality of storage nodes, with the dielectric film interposed between the plate electrode and the plurality of storage nodes; and a fuse electrically connected between said plate electrode and said at least one dummy storage node.

20. A semiconductor memory device comprising:

a p-type semiconductor substrate;

an n-type well formed in the p-type semiconductor substrate;

a plurality of first p-type regions formed in a surface of the n-type well;

a plurality of storage nodes provided in memory cells, respectively, and electrically connected to the first p-type regions;

at least one second p-type region formed in a surface of the p-type semiconductor substrate;

at least one dummy storage node electrically connected to said at least one second p-type region such that said at least one dummy storage node is located together with the plurality of storage nodes;

a dielectric film formed on the plurality of storage nodes, except for said at least one dummy storage node;

a plate electrode formed on the plurality of storage nodes, with the dielectric film interposed between the plate electrode and the plurality of storage nodes; and a fuse electrically connected between said plate electrode and said at least one dummy storage node.

21. The semiconductor memory device according to claim 20, wherein said at least one dummy storage node is electrically connected to the p-type semiconductor substrate by a contact which is ohmic-connected to the p-type semiconductor substrate, with the at least one second p-type region interposed between said contact and the p-type semiconductor substrate.

22. The semiconductor memory device according to claim 20, wherein said at least one dummy storage node is electrically connected to the p-type semiconductor substrate by a metal contact forming a Schottky junction with the p-type semiconductor substrate.

23. The semiconductor memory device according to claim 20, wherein said at least one dummy storage node is electrically connected to the p-type semiconductor substrate by a metal contact which is directly connected to the p-type semiconductor substrate.

24. The semiconductor memory device according to claim 20, wherein said at least one dummy storage node is electrically connected to the p-type semiconductor substrate by a polycrystalline semiconductor contact which is directly connected to the p-type semiconductor substrate.

25. A semiconductor memory device comprising:

a p-type semiconductor substrate;

an n-type well formed in the p-type semiconductor substrate;

a p-type well formed within the n-type well;

a plurality of n-type regions formed in a surface of the p-type well;

a plurality of storage nodes provided in memory cells, respectively, and electrically connected to the n-type regions;

at least one p-type region formed in a surface of the p-type semiconductor substrate;

at least one dummy storage node electrically connected to said at least one p-type region such that said at least one dummy storage node is located together with the plurality of storage nodes;

a dielectric film formed on the plurality of storage nodes, except for said at least one dummy storage node;

a plate electrode formed on the plurality of storage nodes, with the dielectric film interposed between the plate electrode and the plurality of storage nodes; and a fuse electrically connected between said plate electrode and said semiconductor substrate through said at least one dummy storage node.

26. A semiconductor memory device comprising:

an n-type semiconductor substrate;

a p-type well formed in the n-type semiconductor substrate;

an n-type well formed within the p-type well;

a plurality of first p-type regions formed in a surface of the n-type well;

a plurality of storage nodes provided in memory cells, respectively, and electrically connected to the first p-type regions;

at least one second p-type region formed in a surface of the n-type semiconductor substrate;

at least one dummy storage node electrically connected to said at least one second p-type region such that said at least one dummy storage node is located together with the plurality of storage nodes;

a dielectric film formed on the plurality of storage nodes, except for said at least one dummy storage node;

a plate electrode formed on the plurality of storage nodes, with the dielectric film interposed between the plate electrode and the plurality of storage nodes; and a fuse electrically connected between said plate electrode and said at least one dummy storage node.

27. A semiconductor memory device comprising:

a semiconductor substrate;

a plurality of storage nodes provided in a memory cell and formed on the semiconductor substrate;

at least one connection, said at least one connection being electrically connected to the semiconductor substrate, said at least one connection including at least one contact which is ohmic-connected to the semiconductor substrate;

a dielectric film formed on the plurality of storage nodes, except for said at least one connection;

a plate electrode electrically connected to said at least one connection; and a fuse electrically connected between said plate electrode and said at least one connection.

* * * * *